(12) United States Patent
Raja Gunaseela Boopathy et al.

(10) Patent No.: US 11,128,954 B2
(45) Date of Patent: Sep. 21, 2021

(54) METHOD AND ELECTRONIC DEVICE FOR MANAGING LOUDNESS OF AUDIO SIGNAL

(71) Applicant: Samsung Electronics Co., Ltd., Gyeonggi-do (KR)

(72) Inventors: Senthil Raja Gunaseela Boopathy, Tamil Nadu (IN); Rishabh Agrawal, Odisha (IN); Ritesh Singh, Maharashtra (IN)

(73) Assignee: Samsung Electronics Co., Ltd

(*) Notice: Subject to any disclaimer, the term of this patent is extended or adjusted under 35 U.S.C. 154(b) by 13 days.

(21) Appl. No.: 16/604,513

(22) PCT Filed: May 25, 2018

(86) PCT No.: PCT/KR2018/005956
§ 371 (c)(1),
(2) Date: Oct. 10, 2019

(87) PCT Pub. No.: WO2018/217059
PCT Pub. Date: Nov. 29, 2018

(65) Prior Publication Data
US 2020/0154202 A1    May 14, 2020

(30) Foreign Application Priority Data

May 25, 2017   (IN) .............................. 201741018467

(51) Int. Cl.
*H04R 3/04*      (2006.01)
*G06F 17/18*     (2006.01)
*G10L 21/0232*   (2013.01)

(52) U.S. Cl.
CPC ............... *H04R 3/04* (2013.01); *G06F 17/18* (2013.01); *G10L 21/0232* (2013.01); *H04R 2430/01* (2013.01)

(58) Field of Classification Search
None
See application file for complete search history.

(56) References Cited

U.S. PATENT DOCUMENTS 7,359,504 B1   4/2008   Reuss et al.
7,516,065 B2   4/2009   Marumoto
(Continued)

FOREIGN PATENT DOCUMENTS

JP         2005-27273         1/2005

OTHER PUBLICATIONS

PCT/ISA/210 Search Report issued on PCT/KR2018/005956, pp. 3.
(Continued)

*Primary Examiner* — Kenny H Truong
(74) *Attorney, Agent, or Firm* — The Farrell Law Firm, P.C.

(57) ABSTRACT

Provided are an electronic device and method for managing the perceived loudness of an input audio signal. The electronic device includes a communication unit configured to communicate with internal units and external devices and receive an audio source signal; a loudness adjustment unit configured to receive the audio source signal from the communication unit and obtain an input audio source signal from the audio source signal; a noise separator configured to separate noise from the input audio source signal; a voice booster configured to boost an output audio signal received from the loudness adjustment unit; a storage unit storing instructions; and at least one processor configured to communicate with the communication unit, the loudness adjustment unit, the noise separator, the voice booster, and the storage unit and control operations thereof by executing the stored instructions.

13 Claims, 5 Drawing Sheets

(56) References Cited

U.S. PATENT DOCUMENTS

| | | |
|---|---|---|
| 9,431,982 B1 | 8/2016 | Yang et al. |
| 2007/0121966 A1 | 5/2007 | Plastina et al. |
| 2009/0010453 A1* | 1/2009 | Zurek ............... G10L 21/0208 381/94.5 |
| 2012/0121096 A1 | 5/2012 | Chen et al. |
| 2013/0343573 A1 | 12/2013 | Yang et al. |
| 2015/0187350 A1 | 7/2015 | Kim et al. |

OTHER PUBLICATIONS

PCT/ISA/237 Written Opinion issued on PCT/KR2018/005956, pp. 6.
Muhammed Shifas PV et al., "Speech intelligibility enhancement based on a non-causal Wavenet-like model", Interspeech 2018, Sep. 2-6, 2018, Hyderabad, pp. 1868-1872.
Michael A. Stone et al., "Side effects of fast-acting dynamic range compression that affect intelligibility in a competing speech task", J. Acoust. Soc. Am. 116(4), Pt. 1, Oct. 2004, © 2004 Acoustical Society of America, pp. 2311-2323.
Birger Kollmeier et al., "Real-time multiband dynamic compression and noise reduction for binaural hearing aids", Journal of Rehabilitation Research and Development vol. 30 No. 1, 1993, pp. 82-94.
Diane K. Bustamante et al., "Multiband compression limiting for hearing-impaired listeners", Journal of Rehabilitation Research and Development vol. 24 No. 4, Feb. 1987, pp. 149-160.
Rainer Martin, "Spectral Subtraction Based on Minimum Statistics", Proceedings of European Signal Processing Conference 6, 8 (1994), pp. 1182-1185.
Arne Leijon et al., "Fast Amplitude Compression in Hearing Aids Improves Audibility But Degrades Speech Information Transmission", 16th European Signal Processing Conference (EUSIPCO 2008), Lausanne, Switzerland, Aug. 25-29, © by EURASIP, pp. 5.
Yan Tang et al., "A Study on the Relationship between the Intelligibility and Quality of Algorithmically-Modified Speech for Normal Hearing Listeners", Journal of Otorhinolaryngology, Hearing and Balance Medice, 2018, pp. 10.
Tobias Herzke et al., "Effects of Instantaneous Multiband Dynamic Compression on Speech Intelligibility", EURASIP Journal on Applied Signal Processing 2005:18, 3034-3043, © 2005 Hindawi Publishing Corporation.
International Telecommunication Union. Implementers' Guide for ITU-T Recommendation p. 563 (2006), https://www.itu.int/rec/T-REC-P.Imp563-200606-I/en, p. 1.
Ryan J. Cassidy, Dynamic Range Compression of Audio Signals Consistent With Recent Time-Varying Loudness Models, ICASSP 2004, © 2004 IEEE, pp. 4.
Neeraj Magotra et al, Development and Fixed-Point Implementation of a Multiband Dynamic Range Compression (MDRC) Algorithm, Conference Record of the Thirty-Fourth Asilomar Conference on Signals, Systems and Computers 1, © 2000 IEEE, pp. 428-432.

* cited by examiner

[Fig. 1]
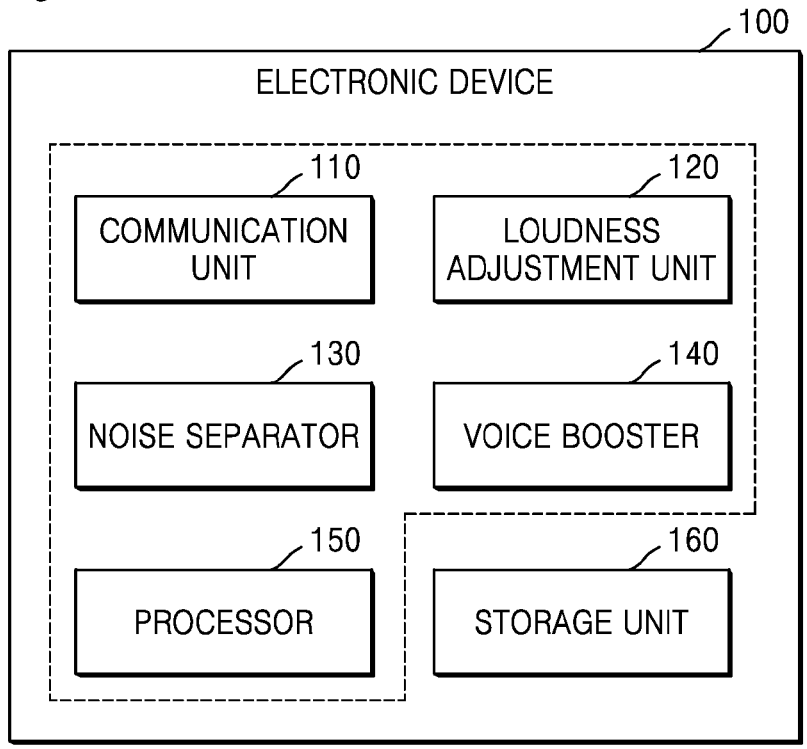
[Fig. 2]
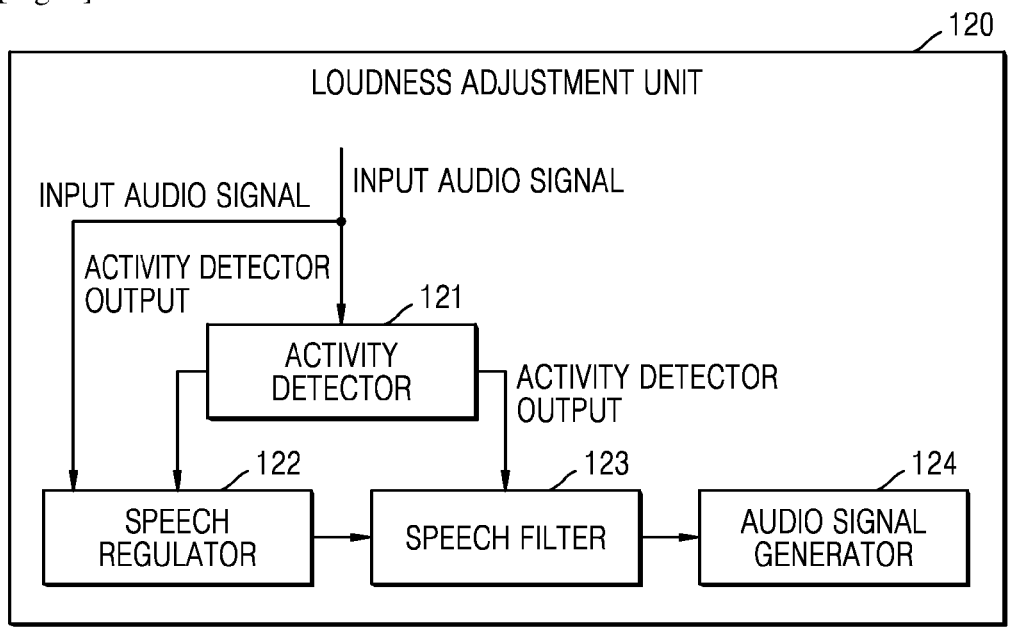

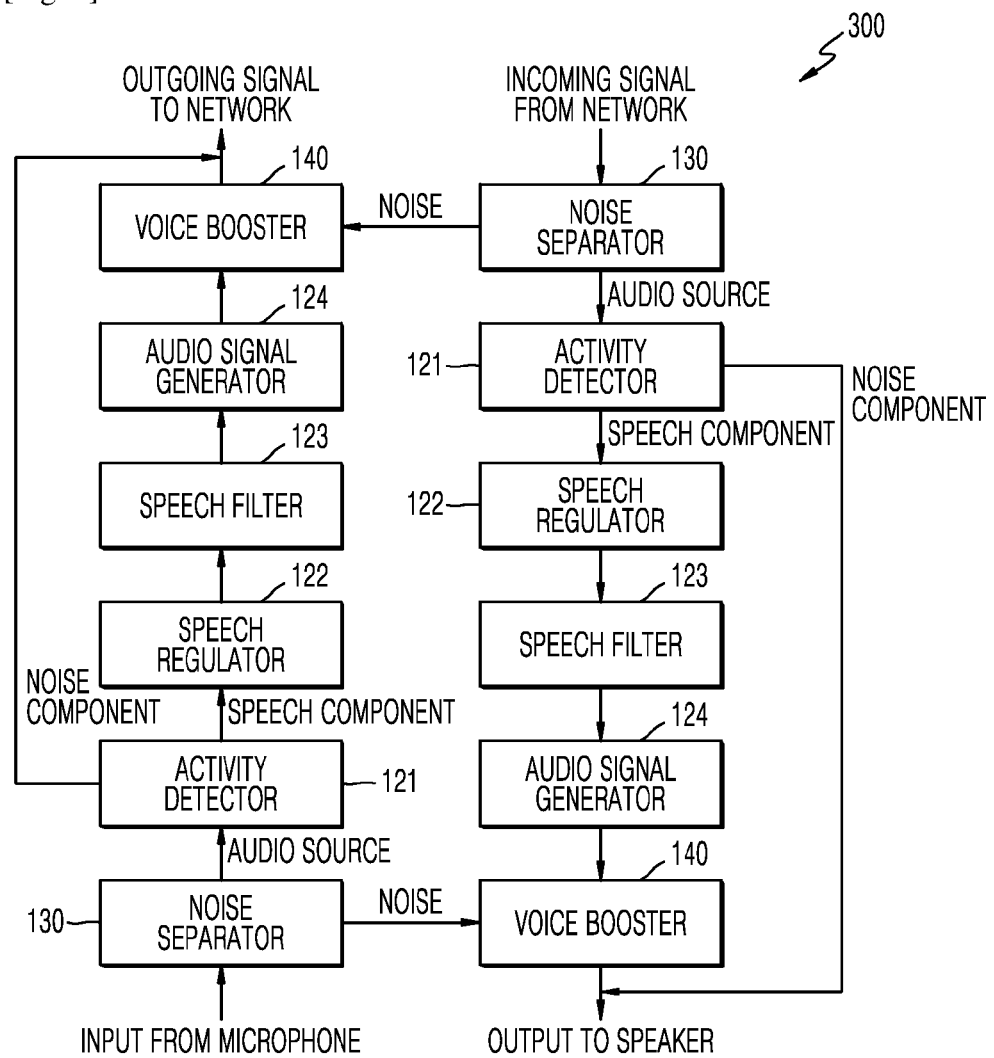
[Fig. 3]

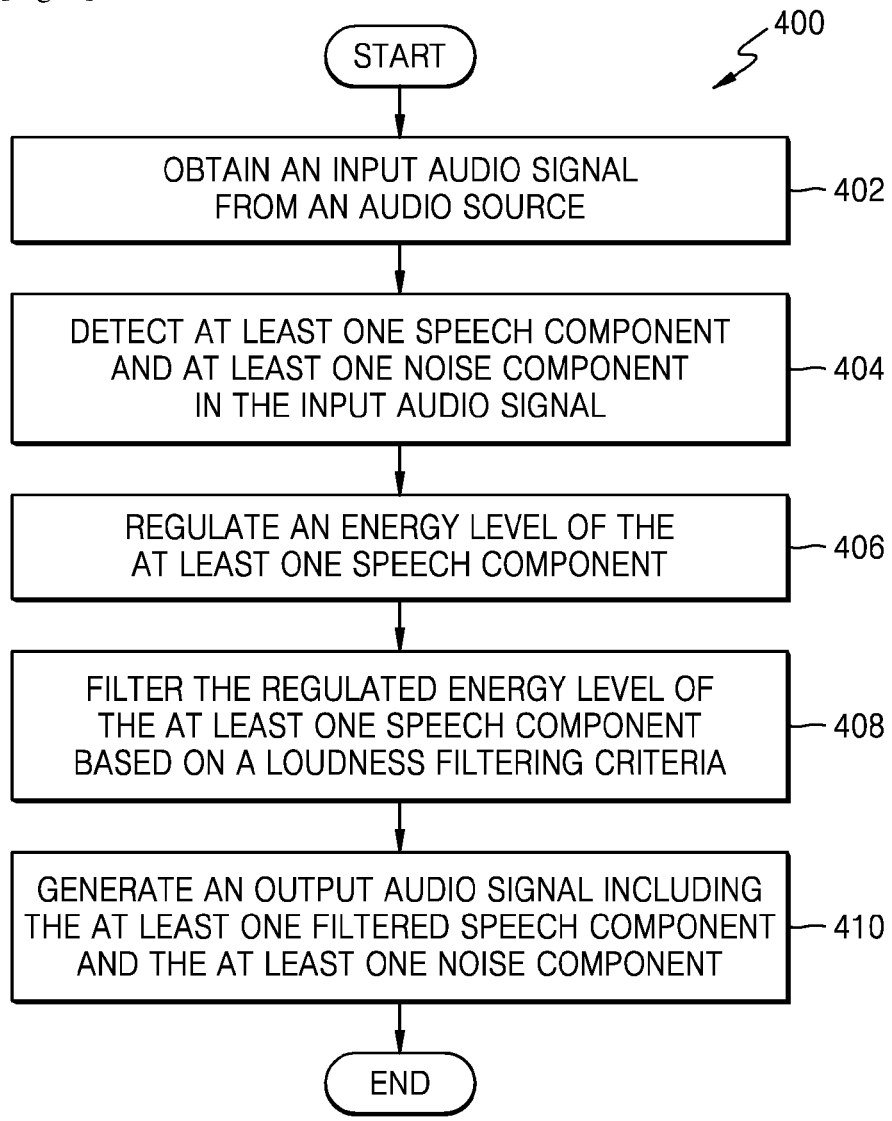

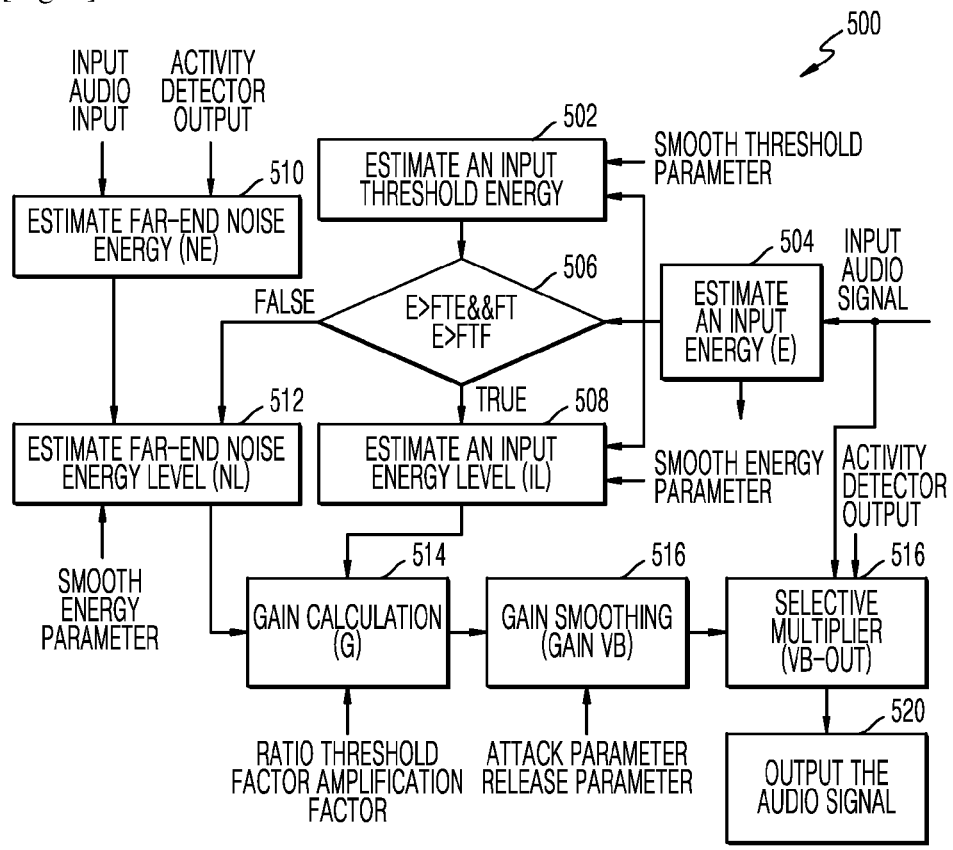
[Fig. 5]
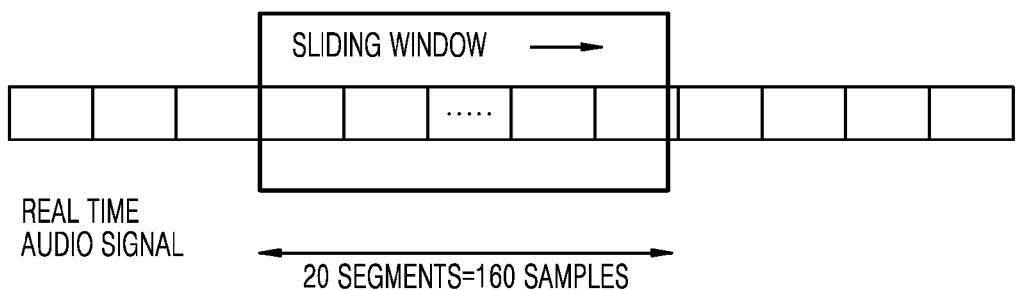
[Fig. 6]

[Fig. 7]
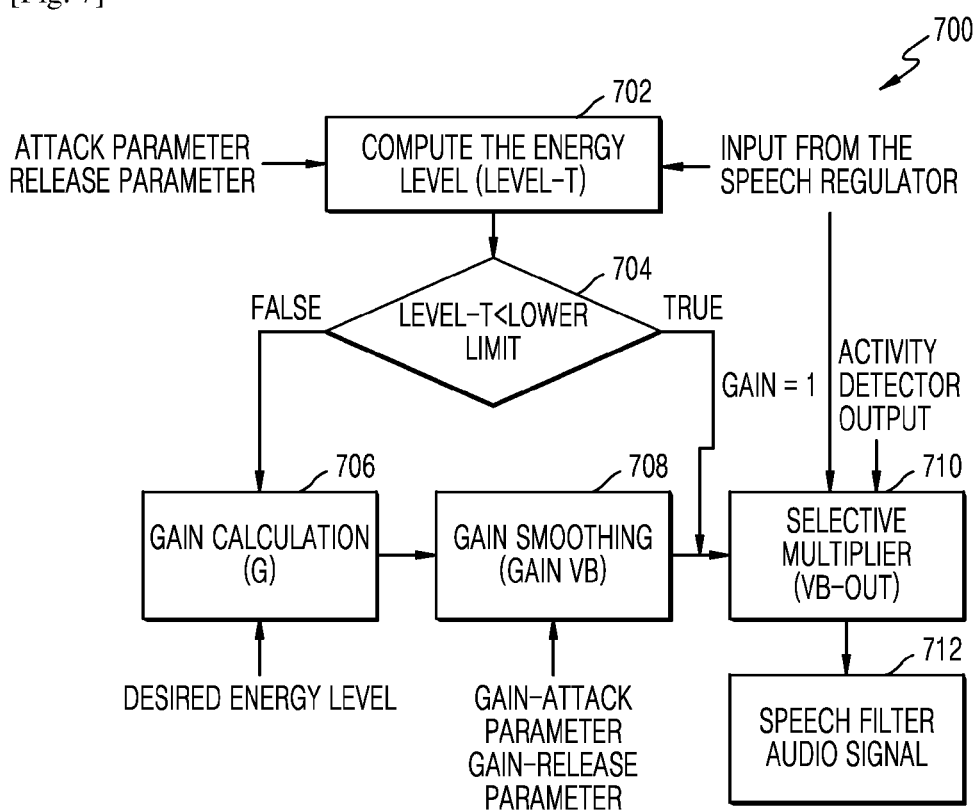

METHOD AND ELECTRONIC DEVICE FOR MANAGING LOUDNESS OF AUDIO SIGNAL

PRIORITY

This application is a National Phase Entry of PCT International Application No. PCT/KR2018/005956 which was filed on May 25, 2018, and claims priority to Indian Patent Application No. 201741018467, which was filed on May 25, 2017, the content of each of which is incorporated herein by reference.

TECHNICAL FIELD

The disclosure relates to loudness adjustment. More particularly, the disclosure relates to an electronic device and method for managing the perceived loudness of an input audio signal.

BACKGROUND ART

In general, traditional methods of controlling a gain of an audio signal output by an electronic device involve controlling the volume of the output audio signal by using a hardware and software volume controller installed in the electronic device. These methods require a user of the electronic device to manually adjust the volume for different audio signals. Feeble signals associated with the audio signal require the user to increase the volume setting (i.e., in the form of a higher amplitude gain), whereas loud signals associated with the audio signal require the user to reduce the volume setting (i.e., in the form of a lower amplitude gain). In these methods, the user intervention requires changes in the volume setting according to the audio volume characteristics of the received audio signal. This results in a huge user inconvenience.

Thus, it is desired to address the above-mentioned disadvantages or other shortcomings or at least provide a useful alternative.

DISCLOSURE OF INVENTION

Solution to Problem

An electronic device for managing perceived loudness of an input audio includes an activity detector, a speech regulator, a speech filter, and an audio signal generator. The activity detector is configured to obtain the input audio signal from an audio source and to detect at least one speech component and at least one noise component in the input audio signal. The speech regulator is configured to regulate an energy level of the at least one speech component. The speech filter is configured to filter the regulated energy level of the at least one speech component based on a loudness filtering criteria. The audio signal generator is configured to generate an output audio signal including the at least one filtered speech component and the at least one noise component.

Advantageous Effects of Invention

The disclosure provides an effective method and device relating to an electronic device for managing perceived loudness of an input audio signal.

BRIEF DESCRIPTION OF DRAWINGS

The above and other aspects, features, and advantages of certain embodiments of the disclosure will become more apparent from the following description taken in conjunction with the accompanying drawings, in which:

FIG. 1 illustrates various hardware components of an electronic device, according to an embodiment of the disclosure;

FIG. 2 illustrates various hardware components of a loudness adjustment unit, according to an embodiment of the disclosure;

FIG. 3 is an overview of a system to manage perceived loudness of an input audio signal, according to an embodiment of the disclosure;

FIG. 4 is a flow diagram of a method of managing perceived loudness of an input audio signal, according to an embodiment of the disclosure;

FIG. 5 is a flow diagram of a method of regulating an energy level of at least one speech component, while managing perceived loudness of an input audio signal, according to an embodiment of the disclosure;

FIG. 6 is a view illustrating an energy estimation calculation with a sliding window, according to an embodiment of the disclosure; and FIG. 7 is a flow diagram of a method of filtering the regulated energy level of the at least one speech component based on a loudness filtering criteria, while managing the perceived loudness in the input audio signal, according to an embodiment of the disclosure.

BEST MODE FOR CARRYING OUT THE INVENTION

Provided are a method and electronic device for achieving a uniform loudness experience as preferred by a user while preserving tonal balance in a low processing power system.

In accordance with an aspect of the disclosure, an intensity of an audio signal is normalized in real time by boosting feeble parts of the audio signal and attenuating loud parts thereof to provide a uniform loudness experience as preferred by the user.

In accordance with an aspect of the disclosure, a loudness adjustment unit includes an activity detector, a speech regulator, and a speech filter to enhance the speech quality of the audio signal as preferred by the user.

In accordance with an aspect of the disclosure, an electronic device for managing perceived loudness of an input audio includes an activity detector, a speech regulator, a speech filter, and an audio signal generator. The activity detector is configured to obtain the input audio signal from an audio source and to detect at least one speech component and at least one noise component in the input audio signal. The speech regulator is configured to regulate an energy level of the at least one speech component. The speech filter is configured to filter the regulated energy level of the at least one speech component based on a loudness filtering criteria. The audio signal generator is configured to generate an output audio signal including the at least one filtered speech component and the at least one noise component.

In accordance with an aspect of the disclosure, a method of managing perceived loudness of an input audio signal includes obtaining the input audio signal from an audio source and detecting at least one speech component and at least one noise component in the input audio signal. Further, the method includes regulating an energy level of the at least one speech component. Further, the method includes filtering the regulated energy level of the at least one speech component based on a loudness filtering criteria. Further, the method includes generating an output audio signal including the at least one filtered speech component and the at least one noise component.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

MODE FOR THE INVENTION

It may be advantageous to set forth definitions of certain words and phrases used throughout this document. The terms "include" and "comprise," as well as derivatives thereof, mean inclusion without limitation. The term "or," is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Also, the various embodiments described herein are not necessarily mutually exclusive, as some embodiments may be combined with one or more other embodiments to form new embodiments. The examples used herein are intended merely to facilitate an understanding of ways in which the embodiments herein may be practiced and to further enable those skilled in the art to practice the embodiments. Accordingly, the examples should not be construed as limiting the scope of the embodiments.

Various embodiments may be described and illustrated in terms of blocks which carry out a described function or functions. These blocks, which may be referred to as units, modules, or the like, are physically implemented by analog or digital circuits such as logic gates, integrated circuits, microprocessors, micro-controllers, memory circuits, passive electronic components, active electronic components, optical components, hardwired circuits, or the like, and may optionally be driven by firmware and software. The circuits may, for example, be embodied in one or more semiconductor chips, or on substrate supports such as printed circuit boards and the like. The circuits constituting a block may be implemented by dedicated hardware, by a processor (e.g., one or more programmed microprocessors and associated circuitry), or by a combination of dedicated hardware to perform some functions of the block and a processor to perform other functions of the block. Each block may be physically separated into two or more interacting and discrete blocks without departing from the scope of the disclosure. Likewise, the blocks may be physically combined into more complex blocks without departing from the scope of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

FIG. 1 illustrates an electronic device, according to an embodiment of the disclosure. Referring to FIG. 1, an electronic device 100 may include, but is not limited to, a smartphone, a mobile phone, a laptop, a desktop, a Personal Digital Assistance (PDA), or the like. The electronic device 100 may include a communication unit 110, a loudness adjustment unit 120, a noise separator 130, a voice booster 140, a processor 150, and a storage unit 160. The communication unit 110, the loudness adjustment unit 120, the noise separator 130, the voice booster 140, and the processor 150 can be implemented as at least one hardware processor (not shown).

The communication unit 110 may communicate with internal units and external devices via one or more networks. Further, the communication unit 110 may receive an audio source signal and send the audio source signal to the loudness adjustment unit 120. After receiving the audio source signal, the loudness adjustment unit 120 may obtain an input audio signal from the audio source signal. After obtaining the input audio signal from the audio source signal, the loudness adjustment unit 120 may detect at least one speech component and at least one noise component in the input audio signal.

In an embodiment, the loudness adjustment unit 120 may detect the at least one speech component in at least one frame of the input audio signal in the time domain. The at least one speech component in the input audio signal may be detected by associating probabilities of speech presence in each of the frames with each frequency sub-band in a power spectrum of the input audio signal.

In an embodiment, a mean power for each of the frequency sub-bands may be weighted over a smoothed power spectrum value of the probabilities of speech presence over all the frequency sub-bands.

In an embodiment, a threshold on a weighted average of the smoothed power spectrum value of the probabilities of speech presence over all the frequency sub-bands may be used to identify the at least one speech components.

In an embodiment, the threshold may be used to control a narrowness of the frames associated with the at least one speech component.

In an embodiment, the smoothed power spectrum value may be used to control the frames associated with the at least one speech component over a time.

After detecting the at least one speech component and the at least one noise component in the input audio signal, the loudness adjustment unit 120 may regulate an energy level of the at least one speech component.

In an embodiment, the loudness adjustment unit 120 may regulate the energy level of the at least one speech component by estimating the energy level for at least one frame of the input audio signal, determining whether the energy level for the at least one frame meets a speech regulation criteria, and varying the energy level of the at least one speech component based on the speech regulation criteria.

In an embodiment, the energy level for the at least one frame may be estimated based on a mean energy of each frame of the input audio signal over a sliding window.

In an embodiment, the speech regulation criteria may include an input energy threshold and a far-end energy threshold.

In an embodiment, the loudness adjustment unit 120 may estimate an input signal energy level for the at least one frame of the input audio signal. The input signal energy level may be estimated by averaging the energy of the at least one speech component and the input audio signal over a fixed time window. After estimating the input signal energy level for the at least one frame of the input audio signal, the loudness adjustment unit 120 may regulate the energy level of the at least one speech component by selectively multiplying with the input signal based on a gain component, when the energy level meets the speech regulation criteria. Further, at least one of an attack parameter and release parameter may be used to control a time taken to adapt the regulated energy level of the at least one speech component.

In an embodiment, the at least one frame, for which the input signal level is estimated, may include a mean estimated energy greater than an input energy threshold.

In an embodiment, the energy level of the at least one speech component may be selectively smoothed over the time interval determined by a smooth energy parameter.

In an embodiment, the gain component may be applied to the input signal to achieve a desired signal to noise ratio (SNR).

In an embodiment, the gain component may be smoothed over time for avoiding a sudden change in the volume.

In an embodiment, the loudness adjustment unit 120 may estimate a far-end noise energy level for the at least one frame of the input audio signal. The far-end noise energy level may be estimated by averaging an energy of the at least one noise component and the input audio signal over the fixed time window. Further, the loudness adjustment unit 120 may regulate the energy level of the at least one speech component by selectively multiplying with the gain component based on the far-end noise energy level, when the energy level does not meets the speech regulation criteria. The at least one of the attack parameter and the release parameter may be used to control the time taken to adapt the regulated energy level of the at least one speech component.

In an embodiment, the energy level of the at least one noise component may be selectively smoothed over a time interval determined by a smooth energy parameter.

In an embodiment, the gain component may be applied to the input signal to achieve the desired SNR, and the gain component may be smoothed over time for avoiding a sudden change in volume.

After regulating the energy level of the at least one speech component, the loudness adjustment unit 120 may filter the regulated energy level of the at least one speech component based on a loudness filtering criteria.

In an embodiment, the loudness adjustment unit 120 may filter the regulated energy level of the at least one speech component based on the loudness filtering criteria by determining whether the regulated energy level of the at least one speech component meets the loudness filtering criteria, and selectively applying the gain component to the at least one speech component of the input signal.

In an embodiment, the loudness filtering criteria may be dynamically determined based on the attack parameter and the release parameter. The attack parameter and the release parameter may determine a convergence time taken to reach a stable loudness level defined by the user.

In an embodiment, the at least one of the attack parameter and the release parameter may be set to remain in accordance with equal loudness contours.

The attack parameter and the release parameter may provide large attack and release times so that changes in the gain are smooth. The smooth changes in the gain may lead to a realistic human voice experience with temporally smooth ups and downs in loudness, while avoiding discomfort caused by sharp and sudden changes in loudness.

In an embodiment, the gain component may be determined based on a ratio of the desired energy level to a current energy level of the input audio signal. The gain component may be smoothed over time for avoiding a sudden change in volume.

After filtering the regulated energy level of the at least one speech component, the loudness adjustment unit 120 may generate an output audio signal including the at least one filtered speech component and the at least one noise component.

Further, the noise separator 130 may operate in the frequency domain. The loudness adjustment unit 120 may selectively enhance the signal only when the audio is detected, thus improving the SNR of the signal. This is achieved in practice by associating probabilities of speech presence with each frequency sub-band in the power spectrum of audio signal. The input audio signal may be segmented into overlapping frames of same size N/2 and the frame values may be scaled with a hamming window of N points.

$$X_t(k) = \mathit{fft}(x_t, N) \qquad \text{Equation (1)}$$

$$P_x^t(k) = |X_t(k)|^2 = X_t(k)^* X_t(k) \qquad \text{Equation (2)}$$

$$S_x^t(k) = \alpha_s * S_x^{t-1}(k) + (1-\alpha_s)*P_x^t(k) \qquad \text{Equation (3)}$$

An N-point Fast Fourier Transform (using the equation 1) may be applied to transform the signal into the frequency domain having N equally separated frequency bins (k). For each frequency sub-band, running mean power (using equations 2 and 3) may be calculated over a specific time window. The probability of speech presence in the frame of the sub-band may be then determined by the ratio of mean local energy $(S_x^t(k)_{min})$ of the input signal to its minimum $(S_x^t(k)_{min})$ over the specified time window. The smoothing parameter $(\alpha_s)$ may be used to control the time window for estimating the average power.

$$S_t^*(k)_{min} = \min\{S_x^t(k)\} \text{ for } t-2L < t' < t \qquad \text{Equation (4)}$$

$$S_x^0(k) \; t = 0 \qquad \text{Equation (5)}$$

$$S_x^t(k)_{min} = \begin{cases} \min\{S_x^{t-1}(k)_{min}, S_x^t(k)\} & \text{if } t \% L \neq 0 \\ \min\{S_x^{t-1}(k)_{tmp}, S_x^t(k)\} & \text{otherwise} \end{cases}$$

$$S_x^0(k) \text{ if } t = 0 \qquad \text{Equation (6)}$$

$$S_x^t(k)_{tmp} = \begin{cases} \min\{S_x^{t-1}(k)_{tmp}, S_x^t(k)\} & \text{if } t \% L \neq 0 \\ S_x^t(k) & \text{otherwise} \end{cases}$$

The conditional probability of speech presence factor (SPF) for each frequency sub-band may be then derived by comparing current frame normalized power amplitudes in the frequency domain to its minimum for specified past interval (using the Equation 7). A global minima may be updated over the time period of length 2 L based on the local minima found in a time frame of length L (4, 5, 6). The probability of speech presence estimation has been improved with the selective frequency region according to experimental results.

$$SPF^t(k) = \frac{S_x^t(k)}{S_x^t(k)_{min}} \qquad \text{Equation (7)}$$

The probability may be smoothed to get Smoothed Speech Presence Factor (SSPF) over time for smooth adaptation. A speech presence threshold (T) value on the ratio may determine the shift of probability towards speech or non-speech. If the ratio is higher than a pre-determined threshold, then the probability may shift more towards presence of the speech (using the Equation 8). The shift parameter $\alpha_p$ may determine the rate of movement of probability towards unity in case of speech presence and towards null value in case of the non-speech detection.

$$SSPF^t(k) = \begin{cases} \alpha_p * SSPF^{t-1}(k) + (1 - \alpha_p) & \text{if } SPF^t(k) > T \\ \alpha_p * SSPF^{t-1}(k) & \text{if } SPF^t(k) \leq T \end{cases} \qquad \text{Equation (8)}$$

If the ratio is lower than the pre-determined threshold, then the probability then may shift more towards non-speech (using Equation 8). The higher the probability of the speech associated with the frequency band, the higher the contribution of the probability to the voice estimate. In order to associate each frame with speech probability (SP), the mean power for each frequency sub-band may be weighted over the smoothed probability of speech presence (using the equation 9).

$$SP^t = \frac{\sum_{k=1}^{N} S_x^t(k) * SSPF^t(k)}{\sum_{k=1}^{N} S_x^t(k)} \qquad \text{Equation (9)}$$

In an embodiment, the sum of frequency components containing only the noise separated by the noise separator 130 may be sent to the voice booster 140 along a path of an outgoing signal.

The sum of frequency components without noise (separated by the noise separator 130) may be sent to the loudness adjustment unit 120 along a path of the incoming signal. Further, the loudness adjustment unit 120 may detect the presence of voice in the chunk of the signal in the time domain. If the voice is not detected in the signal by the loudness adjustment unit 120, the signal may directly go to a speaker.

A threshold (th) on the weighted average of smoothed power spectrum value of the probability of speech presence over all frequency sub-bands may be used to categorize the audio frame into the voice or the non-voice part (VAD) in the time domain (using Equation 10).

$$VAD^t = \begin{cases} 0, & SP^t < th \\ 1, & SP^t \geq th \end{cases} \qquad \text{Equation (10)}$$

The threshold parameter (th) may be used to control the narrowness of speech frames for each word, whereas the smoothing parameter of speech probability controls speech frames over the time.

The processor 150 may communicate with the communication unit 110, the loudness adjustment unit 120, the noise separator 130, the voice booster 140, and the storage unit 160. The storage unit 160 may include one or more computer-readable storage media. The storage unit 160 may include non-volatile storage elements. In addition, the storage unit 160 may, in some embodiments, include a non-transitory storage medium. The term "non-transitory" may indicate that the storage medium is not embodied in a carrier wave or a propagated signal. However, the term "non-transitory" should not be interpreted in the sense that the storage unit 160 is non-movable.

FIG. 2 illustrates the loudness adjustment unit 120, according to an embodiment of the disclosure. The loudness adjustment unit 120 may include an activity detector 121, a speech regulator 122, a speech filter 123, and an audio signal generator 124. The activity detector 121 may obtain the input audio signal from the audio source. After obtaining the input audio signal from the audio source, the activity detector 121 may detect the speech component and the noise component in the input audio signal.

In an embodiment, the activity detector 121 may detect the speech component in the at least one frame of the input audio signal in the time domain.

After detecting the speech component and the noise component in the input audio signal, the speech regulator 122 may regulate the energy level of the speech component.

In an embodiment, the speech regulator 122 may regulate the energy level of the speech component by estimating the energy level for the frame of the input audio signal, determining whether the energy level for the frame meets the speech regulation criteria, and varying the energy level of the speech component based on the speech regulation criteria.

In an embodiment, the speech regulator 122 may estimate the input signal energy level for the frame of the input audio signal. The input signal energy level associated with the speech component may be estimated by averaging the energy of the speech component and the input audio signal over the fixed time window. After estimating the input signal energy level for the frame of the input audio signal, the speech regulator 122 may regulate the energy level of the speech component by selectively multiplying with the input signal based on the gain component, when the energy level meets the speech regulation criteria. Further, the attack parameter and the release parameter may be used to control the time taken to adapt the regulated energy level of the speech component.

In an embodiment, the speech regulator 122 may estimate the far-end noise energy level for the frame of the input audio signal. The far-end noise energy level may be estimated by averaging the energy of the noise component and the input audio signal over the fixed time window. Further, the speech regulator 122 may regulate the energy level of the speech component by selectively multiplying with the gain component based on the far-end noise energy level, when the energy level does not meets the speech regulation criteria. The attack parameter and the release parameter may be used to control the time taken to adapt the regulated energy level of the at least one speech component.

After regulating the energy level of the speech component, the speech filter 123 may filter the regulated energy level of the speech component based on the loudness filtering criteria.

In an embodiment, the speech filter 123 may filter the regulated energy level of the speech component based on the loudness filtering criteria by determining whether the regulated energy level of the speech component meets the loudness filtering criteria, and selectively applying the gain component to the speech component of input signal.

After filtering the regulated energy level of the speech component, the audio signal generator 124 may generate the output audio signal including the filtered speech component and the noise component.

The activity detector 121, the speech regulator 122, and the speech filter 123 may provide enhanced voice quality in an intelligible manner even though real-time processing is used in a relatively low processing power system.

The speech regulator 122 and the speech filter 123 may be operated in the time domain while the activity detector 121 may operate in the frequency domain. The activity detector 121 may operate based on a Minima-Controlled Recursive Averaging (MCRA) procedure, so that the activity detector 121 may selectively enhance the speech presence in the input audio signal with a minimum change in the intensity of a noisy background. This results in enhancing speech quality and improving the SNR of the audio input signal.

FIGS. 1 and 2 show hardware components of the electronic device 100 and the loudness adjustment unit 120 but the disclosure is not limited thereto. In other embodiments, the electronic device 100 and the loudness adjustment unit 120 may include less or more hardware components. Two or more hardware components may be combined together to perform same or substantially similar functions to manage the perceived loudness of the input audio signal.

FIG. 3 illustrates a system 300 to manage perceived loudness of an input audio signal, according to an embodiment of the disclosure. Initially, the user may set the preferred loudness level (i.e., a preferred gain level) on the electronic device 100 by using hardware or software volume buttons. Further, the noise separator 130 may detect the probability of the frequency component of the incoming audio signal being completely noise and may separate the noise if the probability is higher than the threshold.

Further, the sum of frequency components containing only noise separated by the noise separator 130 may be sent to the voice booster 140 along a path of an outgoing signal.

Further, the sum of frequency components without noise separated by the noise separator 130 may be sent to the activity detector 121 along a path of an incoming signal. The activity detector 121 may detect the presence of voice in the chunk of the signal in the time domain. If the voice is detected in the signal by the activity detector 121, the voice signal may be sent to the speech regulator 122 and then the speech filter 123. If the voice is not detected in the signal by the activity detector 121, the signal may be sent directly to a speaker.

The speech regulator 122 may enhance the intensity of the current chunk of the signal in the time domain, if the voice activity is detected by the activity detector 121. The speech filter 123 then may limit the intensity of the current chunk of the signal based on the detected voice activity by the activity detector 121 and the sound energy of the current chunk of the signal.

The activity detector 121 may increase the SNR of the modified signal by selectively applying the speech regulator 122 only with respect to parts of the signal where the voice is detected. The speech filter 123 then may limit the entire signal to the desired level set by the user, thus increasing the resultant SNR of the signal. The activity detector 121, the speech regulator 122, and the speech filter 123 may be used on transmission and receiving channels to enhance the audio for both near-end and far-end users. Further, the noise separator 130 may be used on both the transmission and receiver channels to enhance the far-end signal in case of near end noise and near-end signal in case of far-end noise.

The functions and operations of the activity detector 121, the speech regulator 122, the speech filter 123, the audio signal generator 124, the noise separator 130, and the voice booster 140 are explained in conjunction with FIGS. 1 and 2.

FIG. 3 shows a limited overview of the system 300, but the system 300 is not limited thereto. The system 300 may include any number of hardware and software components communicating with each other. In an embodiment of the disclosure, both an application running on a device and the device itself may be a component of the system 300.

FIG. 4 is a flow diagram 400 illustrating a method for managing perceived loudness of the input audio signal, according to an embodiment as disclosed herein. In operation 402, the method includes obtaining the input audio signal from the audio source. In operation 404, the method includes detecting the speech component and the noise component in the input audio signal.

In operation 406, the method includes regulating the energy level of the speech component. In operation 408, the method includes filtering the regulated energy level of the speech component based on the loudness filtering criteria. In operation 410, the method includes generating the output audio signal including the filtered speech component and the noise component.

In the method, the intensity of the audio signal is normalized in real time so that the feeble parts of the output audio signal are boosted and the loud parts of the output audio signal are attenuated to give a uniform loudness experience to the user. The tonal balance between each frequency components contribution is preserved to maintain the spectral and emotional aspects of the signal.

The method may be used to improve the audio experience via the electronic device 100 through an automated volume management and provide a constant loudness experience as preferred by the user. Further, the method utilizes a Dynamic Range Compression (DRC) procedure to smoothen out extremities of the volume level but does not completely cancel all differences in the volume level in the original audio source. Therefore, a complete emotion information in the original audio source is retained.

In the proposed method, the intensity of the input audio signal is normalized in real time so that feeble parts of the input audio signal are boosted and loud parts of the input audio signal are attenuated to provide the uniform loudness experience to the user. The tonal balance between each frequency components contribution is preserved to maintain the spectral and emotional aspects of the signal.

FIG. 5 is a flow diagram 500 illustrating a method for regulating the energy level of at least one speech component, while managing the perceived loudness in the input audio signal, according to an embodiment of the disclosure. Operations 502 to 520 are performed by the speech regulator 122. The speech regulator 122 may selectively amplify the voice in the audio signal based on the amplification factor which depends on the SNR ratio. The SNR ratio is calculated from the normalized energy of the input signal over the time frames. The amplification factor also incorporates the absolute energy level of the audio signal. The factor is limited by a maximum value to avoid distortion in the audio signal.

The far end environment noise level and the signal level is estimated by averaging energy of the non-speech segment and the input signal respectively over the fixed time window. The average energy for the noise and input signal is calculated by taking mean of the power over the fixed size sliding window. Within the sliding window each fixed size segment (5% of the sliding window size) is associated with the same power.

The amplification factor is calculated by using the ratio of a signal to noise power level, the gain is smoothed over the time with the attack parameter and the release parameter to avoid abrupt changes in the audio volume level. The effect is that any change in the volume increases or decreases smoothly without hurting an auditory system in the electronic device 100. Finally, only the voiced portion is enhanced by multiplying the gain with the input signal.

In operation 502, the method includes estimating an input threshold energy. In operation 504, the method includes estimating the input energy.

Energy Estimation: In an embodiment, the audio input signal is segmented into frames of a size of 160 samples. Then, each 8 samples are taken as a single segment, thereby dividing the frame into 20 segments as shown in FIG. 6.

Further, the instantaneous mean energy of each segment is averaged over the past sliding window of 20 segments for the current segment's energy ($E_t$) estimation.

In operation 506, the method includes determining whether the energy level for the frame meets the speech regulation criteria. The speech regulation criteria comprises the input energy threshold and the far-end energy threshold.

Threshold Estimation: In an embodiment, in order to estimate the threshold energy (FTE) for the input frame the estimated energy is smoothed (using Equation 11) over the fixed time interval determined by a smooth threshold parameter ($s_t$).

$$FTE_t = s_t * FTE_{t-1} + (1-s_t) * E_t \quad \text{Equation (11)}$$

The threshold energy is important as only those samples is contributing to the energy levels which have their energy greater than the estimated threshold.

If the energy level for the frame meets the speech regulation criteria then, in operation 508, the method includes estimating the input energy level (IL). If the energy level for the frame does not meet the speech regulation criteria then, at 512, the method includes estimating the far-end noise energy level (NL). In operation 510, the method includes estimating the far-end noise energy (NE) prior to estimate the far-end noise energy level (NL).

Energy Level Estimation: The energy level for each segment is calculated independently for the noisy signal (NL) and input signal (IL) respectively using the information from the activity detector 121. The level is determined by selectively smoothing the estimated energy of the segment over the time interval determined by the smooth energy parameter ($s_e$).

$$IL_t = s_e * IL_{t-1} + (1-s_e) * E_t \text{ if } E_t > FTE_t \quad \text{Equation (12)}$$

$$NL_t = s_e * NL_{t-1} + (1-s_e) * E_t \text{ if } VAD_t = 0 \quad \text{Equation (13)}$$

For the input frame energy level estimation (using Equation 12), the samples having the mean estimated energy above the estimated threshold contribute to the energy level. For noise energy level estimation (using Equation 13) only the non-speech samples are considered as per the information obtained from the activity detector 121.

In operation 514, the method includes performing a gain calculation function (G) using the threshold factor and the amplification factor. At 516, the method includes performing a gain smoothing function (Gain VB) using the attack parameter and the release parameter. In operation 518, the method includes performing a selective multiplier operation for the gain smoothing function. At 520, the method includes performing the audio output signal.

Gain Calculation: The smoothed gain ($G_t$) is applied on the input signal speech section to improve the SNR and achieve the desired signal to noise ratio ($SNR_D$) for improving the intelligibility of the input signal.

$$g_t = \sqrt{\frac{SNR_D * NL_t}{IL_t}} \quad \text{Equation (14)}$$

$$G_t = \begin{cases} \alpha_a * G_{t-1} + (1-\alpha_a) * g_t & \text{if } g_t > G_{t-1} \\ \alpha_r * G_{t-1} + (1-\alpha_r) * g_t & \text{if } g_t \leq G_{t-1} \end{cases} \quad \text{Equation (15)}$$

The calculated gain $g_t$ (using Equation 14) is smoothed (using Equation 15) over the time for avoiding the sudden change in the volume. The attack parameter ($\alpha_a$) and the release parameter ($\alpha_r$) parameters may be used to control the time taken to adapt to an increase or decrease in the volume, respectively.

FIG. 7 is a flow diagram 700 illustrating a method for filtering the regulated energy level of the at least one speech component based on the loudness filtering criteria, while managing the perceived loudness in the input audio signal, according to an embodiment as disclosed herein. Operations 702 to 712 are performed by the speech filter 123.

The speech filter 123 may receive an input as the output of the speech regulator 122 and may pass the input through a low pass filter to estimate the energy level. The speech filter 123 may also employ a dynamic range compression on the voice section of the audio signal to attain the desired loudness level as set by the user.

The attack and release parameters may be used to determine the convergence time taken to reach the stable loudness level. The parameter values are set such that it remains in accordance with the equal loudness contours. With the help of these parameters any change in volume level is smoothly attained giving a comfortable loudness transition to the user thus avoiding the threat of the audio shock. The process contains two steps, level detection and gain calculation (i.e., first the energy level is detected which is then compared with the desired level to calculate the gain parameter. The gain is then applied selectively on the speech section of input audio signal and volume level is thus enhanced or attenuated to attain equal loudness).

In operation 702, the method includes computing the energy level (level-t). In operation 704, the method includes determining whether the regulated energy level of the speech component meets the loudness filtering criteria. In an embodiment, the loudness filtering criteria is dynamically determined based on the attack parameter and the release parameter. The attack parameter and the release parameter may be used to determine the convergence time taken to reach the stable loudness level defined by the user.

In an embodiment, the instantaneous energy ($I_t$) for discrete output signal ($o_t$) from the speech regulator 122 may be calculated using Equation 16. The signal is then passed through the low pass filter (using Equation 17) which provides the power level ($L_t$) for this input signal over time. Only samples having their instantaneous energy greater than a preset energy threshold floor (Lower-limit) are taken into consideration. Accordingly, it is made sure that the low power noise samples contribution is eliminated from the level estimation.

$$l_t = o_t * o_t \quad \text{Equation (16)}$$

$$L_t = \begin{cases} \alpha_a * L_{t-1} + (1-\alpha_a) * l_t & \text{if } l_t > L_{t-1} \\ \alpha_r * L_{t-1} + (1-\alpha_r) * l_t & \text{if } l_t \le L_{t-1} \end{cases} \quad \text{Equation (17)}$$

The power level thus obtained reflects the current level of power for the input signal. The attack parameter ($\alpha_a$) and the release parameter ($\alpha_r$) parameters are chosen such that the signal is in accordance with the equal loudness contours as perceived by the human auditory system. The attack and release parameters may be used to determine the time taken to adapt to the changing levels of power of input audio signal.

In operation 706, the method includes performing the gain calculation function (G) based on the desired energy level. In operation 708, the method includes performing the gain smoothing function (Gain VB) using the attack parameter and the release parameter. In operation 710, the method includes selectively applying the smoothing function to the regulated energy level of the speech component to filter the regulated energy level of the speech component. In operation 712, the method includes providing the regulated energy level of the speech component.

Gain Calculation: The gain is calculated (using Equation 18) by using the ratio of the desired energy level ($E_{DL}$) to the current energy level ($L_t$) of the input signal.

$$g_t = \sqrt{\frac{E_{DL}}{L_t}} \quad \text{Equation (18)}$$

The calculated gain is smoothed ($G_t$) over time to avoid sudden changes in the audio volume level (using Equation 19). The attack ($\alpha_{as}$) and release ($\alpha_{rs}$) parameters may be used to control an adaptation time to attain the desired energy level.

$$G_t = \begin{cases} \alpha_{as} * G_{t-1} + (1-\alpha_{as}) * g_t & \text{if } g_t > G_{t-1} \\ \alpha_{rs} * G_{t-1} + (1-\alpha_{rs}) * g_t & \text{if } g_t \le G_{t-1} \end{cases} \quad \text{Equation (19)}$$

The attack parameter may be used to control the sudden increase in volume level and gradually increase the volume. The release parameter may control a sudden fall in a volume level, thereby giving the user a comfortable audio experience.

The various actions, acts, blocks, steps, or the like in the flow diagrams 400, 500, and 700 may be performed in the order presented, in a different order, or simultaneously. Further, in some embodiments, some of the actions, acts, blocks, steps, or the like may be omitted, added, modified, skipped, or the like without departing from the scope of the disclosure.

The embodiments disclosed herein may be implemented through at least one software program running on at least one hardware device and performing network management functions to control the elements. The elements shown in FIGS. 1 to 7 include blocks, elements, actions, acts, steps, or the like which may include at least one of a hardware device or a combination of hardware devices with software modules.

While the disclosure has been shown and described with reference to various embodiments thereof, it will be understood by those skilled in the art that various changes in form and detail may be made therein without departing from the spirit and scope of the disclosure as defined by the appended claims and their equivalents.

The invention claimed is:

1. An electronic device for managing perceived loudness of an input audio signal, the electronic device comprising:
   a processor configured to:
      communicate with internal units and external devices,
      receive an audio source signal,
      obtain an input audio source signal from the audio source signal,
      detect at least one speech component and at least one noise component in the input audio signal,
      regulate an energy level of the at least one speech component by estimating the energy level for at least one frame of the input audio signal, wherein the energy level for the at least one frame is estimated based on a mean energy of each frame of the input audio signal over a sliding window,
      determine whether the energy level for the at least one frame meets a speech regulation criteria, wherein the speech regulation criteria comprises an input energy threshold and a far-end energy threshold,
      regulate the energy level of the at least one speech component based on the speech regulation criteria,
      separate noise from the input audio source signal, and
      boost an output audio signal received obtained from the input audio source signal; and
   a storage unit configured to store the audio source signal, the input audio signal and the output audio signal.

2. The electronic device of claim 1, wherein the processor is further configured to:
   filter the regulated energy level of the at least one speech component based on a loudness filtering criteria; and
   generate the output audio signal comprising the at least one filtered speech component and the at least one noise component.

3. The electronic device of claim 2,
   wherein the detect of the at least one speech component is performed in at least one frame of the input audio signal in a time domain by associating probabilities of speech presence in each of the frames with each frequency sub-band in a power spectrum of the input audio signal,
   wherein a mean power for each of the frequency sub-bands is weighted over a smoothed power spectrum value by using the probabilities of speech presence over all the frequency sub-bands, and
   wherein a threshold on a weighted average of the smoothed power spectrum value by using the probabilities of speech presence over all the frequency sub-bands is used to identify the at least one speech component.

4. The electronic device of claim 2, wherein the filtering of the regulated energy level of the at least one speech component based on the loudness filtering criteria is performed by:
   determining whether the regulated energy level of the at least one speech component meets the loudness filtering criteria; and
   selectively applying a gain component to the at least one speech component of input signal to filter the regulated energy level of the at least one speech component, wherein the gain component is determined based on a ratio of a desired energy level to a current energy level of the input audio signal.

5. The electronic device of claim 2, wherein the loudness filtering criteria is dynamically determined based on at least one of an attack parameter and a release parameter, wherein the at least one of the attack parameter and the release parameter are used to determine a convergence time taken to reach a stable loudness level defined by a user.

6. The electronic device of claim 1, wherein the regulating of the energy level of the at least one speech component is performed when the energy level meets the speech regulation criteria by:
- estimating an input signal energy level for the at least one frame of the input audio signal, wherein the at least one frame for which the input signal level is estimated comprises a mean estimated energy greater than an input energy threshold; and
- regulating the energy level of the at least one speech component by selectively multiplying at least one speech component with the input signal based on a gain component.

7. The electronic device of claim 1, wherein the regulating of the energy level of the at least one speech component is performed when the energy level does not meet the speech regulation criteria by:
- estimating a far-end noise energy level for the at least one frame of the input audio signal, wherein the far-end noise energy level is estimated by averaging an energy of the at least one noise component in the input audio signal over a fixed time window, wherein the energy level of the at least one noise component is selectively smoothed over a time interval determined by using a smooth energy parameter; and
- regulating the energy level of the at least one speech component by selectively multiplying the at least one speech component with the gain component based on the far-end noise energy level.

8. A method of managing perceived loudness of an input audio signal, the method comprising:
- obtaining, by a processor, the input audio signal from an audio source;
- detecting at least one speech component and at least one noise component in the input audio signal;
- regulating an energy level of the at least one speech component by estimating the energy level for at least one frame of the input audio signal, wherein the energy level for the at least one frame is estimated based on a mean energy of each frame of the input audio signal over a sliding window;
- determining whether the energy level for the at least one frame meets a speech regulation criteria, wherein the speech regulation criteria comprises an input energy threshold and a far-end energy threshold;
- regulating the energy level of the at least one speech component based on the speech regulation criteria;
- filtering the regulated energy level of the at least one speech component based on a loudness filtering criteria; and
- generating an output audio signal comprising the at least one filtered speech component and the at least one noise component.

9. The method of claim 8, wherein the detecting of the at least one speech component in the at least one frame of the input audio signal in a time domain comprises associating probabilities of speech presence in each of the frames with each frequency sub-band in a power spectrum of the input audio signal,
- wherein a mean power for each of the frequency sub-bands is weighted over a smoothed power spectrum value of the probabilities of speech presence over all the frequency sub-bands, and
- wherein a threshold on a weighted average of the smoothed power spectrum value of the probabilities of speech presence over all the frequency sub-bands identifies the at least one speech components.

10. The method of claim 8, wherein the regulating of the energy level of the at least one speech component when the energy level meets the speech regulation criteria comprises:
- estimating an input signal energy level for the at least one frame of the input audio signal, wherein the at least one frame, for which the input signal level is estimated, comprises a mean estimated energy greater than an input energy threshold; and
- regulating the energy level of the at least one speech component by selectively multiplying with the input signal energy based on a gain component.

11. The method of claim 8, wherein the regulating of the energy level of the at least one speech component when the energy level does not meet the speech regulation criteria comprises:
- estimating a far-end noise energy level for the at least one frame of the input audio signal, wherein the energy level of the at least one noise component is selectively smoothed over a time interval determined by a smooth energy parameter; and
- regulating the energy level of the at least one speech component by selectively multiplying with the gain component based on the far-end noise energy level.

12. The method of claim 8, wherein the filtering of the regulated energy level of the at least one speech component based on the loudness filtering criteria comprises:
- determining whether the regulated energy level of the at least one speech component meets the loudness filtering criteria; and
- selectively applying a gain component to the at least one speech component of input signal to filter the regulated energy level of the at least one speech component, wherein the gain component is determined based on a ratio of a desired energy level to a current energy level of the input audio signal.

13. The method of claim 8, wherein the loudness filtering criteria is dynamically determined based on at least one of an attack parameter and a release parameter, wherein the at least one of the attack parameter and the release parameter are used to determine a convergence time taken to reach a stable loudness level defined by a user.

* * * * *